United States Patent
El-Hinnawy et al.

(10) Patent No.: US 10,566,528 B1
(45) Date of Patent: Feb. 18, 2020

(54) HEATING ELEMENT DESIGNS FOR PHASE-CHANGE MATERIAL (PCM) RADIO FREQUENCY (RF) SWITCHES

(71) Applicant: Newport Fab, LLC, Newport Beach, CA (US)

(72) Inventors: Nabil El-Hinnawy, Irvine, CA (US); Gregory P. Slovin, Irvine, CA (US); Michael J. DeBar, Tustin, CA (US); Jefferson E. Rose, Hawthorne, CA (US); David J. Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/221,252

(22) Filed: Dec. 14, 2018

Related U.S. Application Data

(63) Continuation-in-part of application No. 16/163,881, filed on Oct. 18, 2018, and a continuation-in-part of
(Continued)

(51) Int. Cl.
*H01L 21/00* (2006.01)
*H01L 45/00* (2006.01)

(52) U.S. Cl.
CPC .......... *H01L 45/1286* (2013.01); *H01L 45/06* (2013.01); *H01L 45/1226* (2013.01);
(Continued)

(58) Field of Classification Search
CPC ..... H01L 45/06; H01L 45/16; H01L 45/1206; H01L 45/1226; H01L 45/1253; H01L 45/1286; H01L 45/144; H01L 45/1666
(Continued)

(56) References Cited

U.S. PATENT DOCUMENTS 5,976,932 A 11/1999 Kerber
6,448,576 B1 9/2002 Davis
(Continued)

FOREIGN PATENT DOCUMENTS

WO WO 2016/028362 2/2016

OTHER PUBLICATIONS

G. Slovin, et al., "Design Criteria in Sizing Phase-Change RF Switches," in *IEEE Transactions on Microwave Theory and Techniques*, vol. 65, No. 11, pp. 4531-4540, Nov. 2017.
(Continued)

*Primary Examiner* — Brook Kebede
(74) *Attorney, Agent, or Firm* — Farjami & Farjami LLP

(57) ABSTRACT

A radio frequency (RF) switch includes a heating element, a phase-change material (PCM) situated over the heating element, and PCM contacts situated over passive segments of the PCM. The heating element extends transverse to the PCM. The heating element can have a heater line underlying an active segment of the PCM. Alternatively, the heating element can have a split heater lines underlying an active segment of the PCM. The split heater lines increase an area of the active segment of the PCM and reduce a heater-to-PCM parasitic capacitance. A fan-out structure having fan-out metal can connect the heater line to a heater contact. The fan-out structure reduces heat generation outside the active segment of the PCM and reduces a heater contact-to-PCM parasitic capacitance. The fan-out structure can have dielectric segments interspersed between the fan-out metal to reduce dishing.

20 Claims, 11 Drawing Sheets

Related U.S. Application Data application No. 16/103,587, filed on Aug. 14, 2018, now Pat. No. 10,461,253, and a continuation-in-part of application No. 16/103,490, filed on Aug. 14, 2018, now Pat. No. 10,476,001, and a continuation-in-part of application No. 16/103,646, filed on Aug. 14, 2018, now Pat. No. 10,475,993.

(52) U.S. Cl.
CPC ........ *H01L 45/1253* (2013.01); *H01L 45/143* (2013.01); *H01L 45/144* (2013.01)

(58) Field of Classification Search
USPC .................................. 438/48; 257/2; 365/153
See application file for complete search history.

(56) References Cited

U.S. PATENT DOCUMENTS

| | | | |
|---|---|---|---|
| 9,257,647 | B2 | 2/2016 | Borodulin |
| 9,368,720 | B1* | 6/2016 | Moon ................. H01L 45/1286 |
| 9,640,759 | B1 | 5/2017 | Curioni |
| 9,917,104 | B1 | 3/2018 | Roizin |
| 2006/0246712 | A1 | 11/2006 | Kim |
| 2007/0075347 | A1 | 4/2007 | Lai |
| 2013/0187120 | A1 | 7/2013 | Redaelli |
| 2013/0285000 | A1 | 10/2013 | Arai |
| 2014/0264230 | A1 | 9/2014 | Borodulin |
| 2015/0090949 | A1 | 4/2015 | Chang |
| 2016/0035973 | A1 | 2/2016 | Raieszadeh |
| 2016/0071653 | A1 | 3/2016 | Lamorey |
| 2017/0092694 | A1 | 3/2017 | BrightSky |
| 2017/0365427 | A1* | 12/2017 | Borodulin ............... H01L 45/06 |
| 2018/0005786 | A1 | 1/2018 | Navarro |
| 2018/0269393 | A1 | 9/2018 | Zhang |
| 2019/0064555 | A1 | 2/2019 | Hosseini |
| 2019/0067572 | A1 | 2/2019 | Tsai |

OTHER PUBLICATIONS

N. El-Hinnawy et al., "A 7.3 THz Cut-Off Frequency, Inline, Chalcogenide Phase-Change RF Switch Using an Independent Resistive Heater for Thermal Actuation," *2013 IEEE Compound Semiconductor Integrated Circuit Symposium (CSICS)*, Monterey, CA, 2013, pp. 1-4.

G. Slovin, et al. "AlN Barriers for Capacitance Reduction in Phase-Change RF Switches," in *IEEE Electron Device Letters*, vol. 37, No. 5, pp. 568-571, May 2016.

* cited by examiner

HEATING ELEMENT DESIGNS FOR PHASE-CHANGE MATERIAL (PCM) RADIO FREQUENCY (RF) SWITCHES

CLAIMS OF PRIORITY

The present application is a continuation-in-part of and claims the benefit of and priority to application Ser. No. 16/103,490 filed on Aug. 14, 2018, titled "Manufacturing RF Switch Based on Phase-Change Material". The present application is also a continuation-in-part of and claims the benefit of and priority to application Ser. No. 16/103,587 filed on Aug. 14, 2018, titled "Design for High Reliability RF Switch Based on Phase-Change Material". The present application is also a continuation-in-part of and claims the benefit of and priority to application Ser. No. 16/103,646 filed on Aug. 14, 2018, titled "PCM RF Switch Fabrication with Subtractively Formed Heater". The present application is further a continuation-in-part of and claims the benefit of and priority to application Ser. No. 16/163,881 filed on Oct. 18, 2018, titled "Phase-Change Material (PCM) Radio Frequency (RF) Switch Using a Chemically Protective and Thermally Conductive Layer". The disclosures and contents of all of the above-identified applications are hereby incorporated fully by reference into the present application.

BACKGROUND

Phase-change materials (PCM) are capable of transforming from a crystalline phase to an amorphous phase. These two solid phases exhibit differences in electrical properties, and semiconductor devices can advantageously exploit these differences. Given the ever-increasing reliance on radio frequency (RF) communication, there is particular need for RF switching devices to exploit phase-change materials. However, the capability of phase-change materials for phase transformation depends heavily on how they are exposed to thermal energy and how they are allowed to release thermal energy. For example, in order to transform into an amorphous state, phase-change materials may need to achieve temperatures of approximately seven hundred degrees Celsius (700° C.) or more, and may need to cool down within hundreds of nanoseconds.

Heating elements in PCM RF switches often contribute to parasitic capacitances associated with RF frequencies and result in performance tradeoffs. These RF performance tradeoffs can result in wasted power, low breakdown voltage, and decreased reliability. Fabricating heating elements without significant RF performance tradeoffs becomes complex, especially where the PCM RF switch is designed primarily around thermal performance. Accordingly, accommodating PCM in PCM RF switches can present significant manufacturing challenges. Specialty manufacturing is often impractical, and large scale manufacturing generally trades practicality for the ability to control device characteristics and critical dimensions.

Thus, there is a need in the art for reliable PCM RF switches having improved RF performance.

SUMMARY

The present disclosure is directed to heating element designs for phase-change material (PCM) radio frequency (RF) switches, substantially as shown in and/or described in connection with at least one of the figures, and as set forth in the claims.

DETAILED DESCRIPTION

Figure 1:
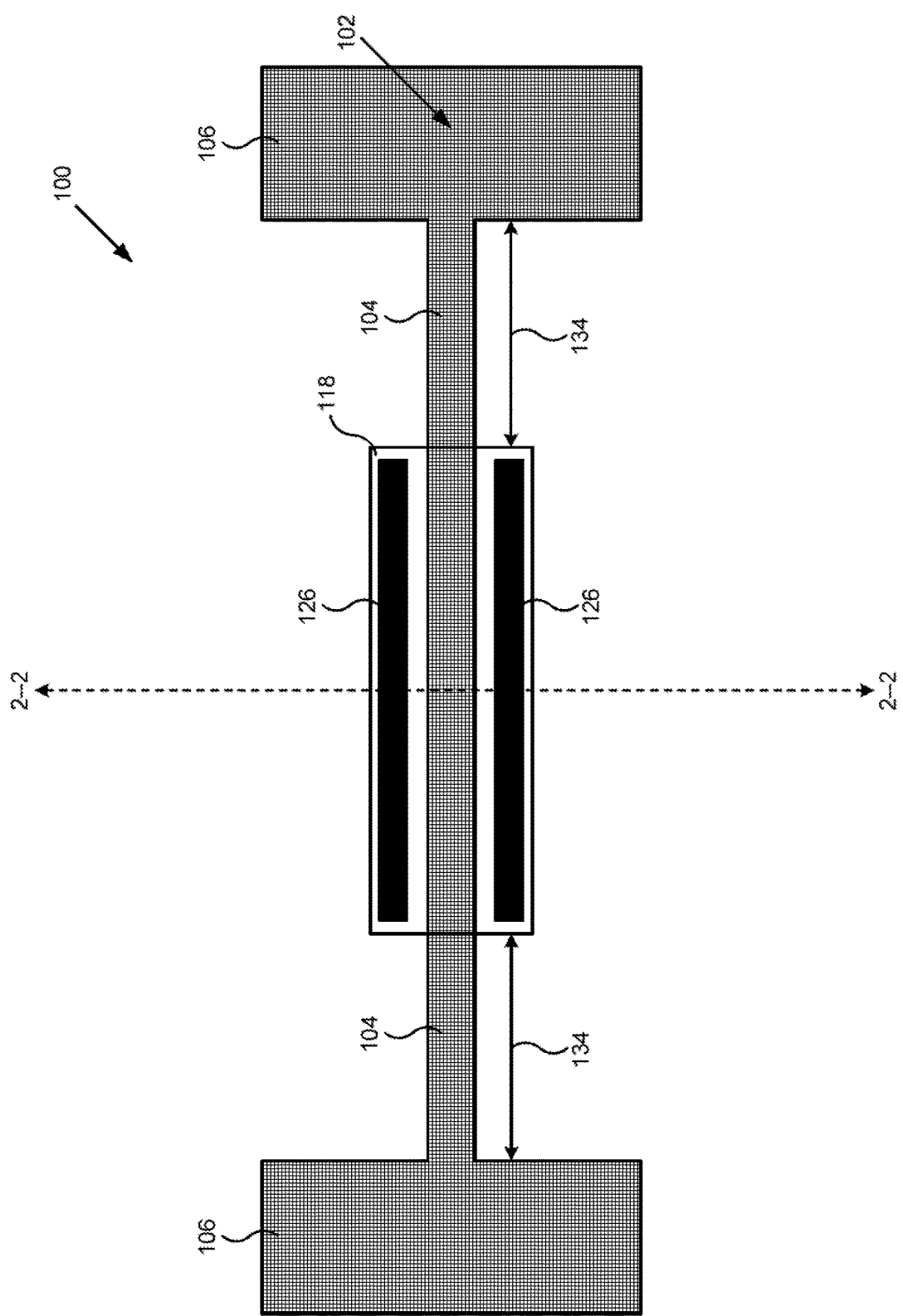
FIG. 1 illustrates a top view of a portion of a radio frequency (RF) switch according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates a top view of a portion of a phase-change material (PCM) radio frequency (RF) switch according to one implementation of the present application. RF switch 100 includes heating element 102 having heater line 104 and heater contacts 106, phase-change material (PCM) 118, PCM contacts 126, and heater contact-to-PCM spacing 134. For purposes of illustration, the top view in FIG. 1 shows selected structures. RF switch 100 may include other structures not shown in FIG. 1.

In FIG. 1, heating element 102 generates a crystallizing pulse or an amorphizing pulse for transforming an active segment of PCM 118, as described below. Heating element 102 can comprise any material capable of Joule heating. Preferably, heating element 102 comprises a material that exhibits minimal or substantially no electromigration, thermal stress migration, and/or agglomeration. In various implementations, heating element 102 can comprise tungsten (W), molybdenum (Mo), titanium (Ti), titanium nitride (TiN), titanium tungsten (TiW), tantalum (Ta), nickel chromium (NiCr), or nickel chromium silicon (NiCrSi). For example, in one implementation, heater line 104 comprises tungsten lined with titanium and titanium nitride. Heating element 102 may be formed by a damascene process, a subtractive etch process, or any other suitable process.

Heating element 102 extends along RF switch 100 transverse to PCM 118, and includes heater line 104 and heater contacts 106. Heater line 104 is approximately centered along heating element 102. Heater line 104 underlies PCM 118, and is seen through PCM 118. Heater contacts 106 are situated at the two ends of heating element 102. In the present implementation, heater contacts 106 occupy a relatively a large area; in other implementations, heater contacts 106 may have any other size or shape. Heater contacts 106 provide for connection of, for example, a current source (not shown) to heater line 104.

PCM 118 overlies heater line 104 of heating element 102. In response to a crystallizing or an amorphizing heat pulse generated by heating element 102, PCM 118 can transform from a crystalline phase that easily conducts electrical current to an amorphous phase that does not easily conduct electrical current and, thus, can transform the state of RF switch 100 to an ON state or an OFF state. PCM 118 can be germanium telluride ($Ge_XTe_Y$), germanium antimony telluride ($Ge_XSb_YTe_Z$), germanium selenide ($Ge_XSe_Y$), or any other chalcogenide. In various implementations, PCM 118 can be germanium telluride having from forty percent to sixty percent germanium by composition (i.e., $Ge_XTe_Y$, where $0.4 \leq X \leq 0.6$ and $Y=1-X$). The material for PCM 118 can be chosen based upon ON state resistivity, OFF state electric field breakdown threshold, crystallization temperature, melting temperature, or other considerations. PCM 118 can be deposited, for example, by physical vapor deposition (PVD) sputtering, chemical vapor deposition (CVD), evaporation, or atomic layer deposition (ALD).

PCM contacts 126 connect to passive segments of PCM 118. PCM contacts 126 provide RF signals to and from PCM 118. In various implementations, PCM contacts 126 can comprise tungsten (W), aluminum (Al), or copper (Cu).

In RF switch 100, heater contacts 106 are relatively large so that heating element 102 can generate a crystallizing pulse or an amorphizing pulse for transforming an active segment of PCM 118. For example, electrodes of a current source (not shown in FIG. 1) large enough to handle a crystallizing current pulse or an amorphizing current pulse without significant losses can connect to heater contacts 106. However, large heater contacts 106 create strong parasitic capacitances with PCM 118 and with PCM contacts 126, especially when heater contact-to-PCM spacing 134 is small. These parasitic capacitances, referred to collectively as "heater contact-to-PCM parasitic capacitance," significantly degrade the frequency response of RF switch 100 in both the ON and OFF states.

In one approach, heater contacts 106 are further separated, heater line 104 is extended, and heater contact-to-PCM spacing 134 is increased. Although this approach reduces heater contact-to-PCM parasitic capacitance, the longer extension of heater line 104 increases its resistance. More heat is generated by heater line 104 outside PCM 118, which wastes power, can undesirably heat structures other than PCM 118, and generally decreases the reliability of RF switch 100. Additionally, the difference in size and the sharp angles between heater line 104 and heater contact 106 cause current crowding and electromigration damage in heating element 102.

Figure 2:
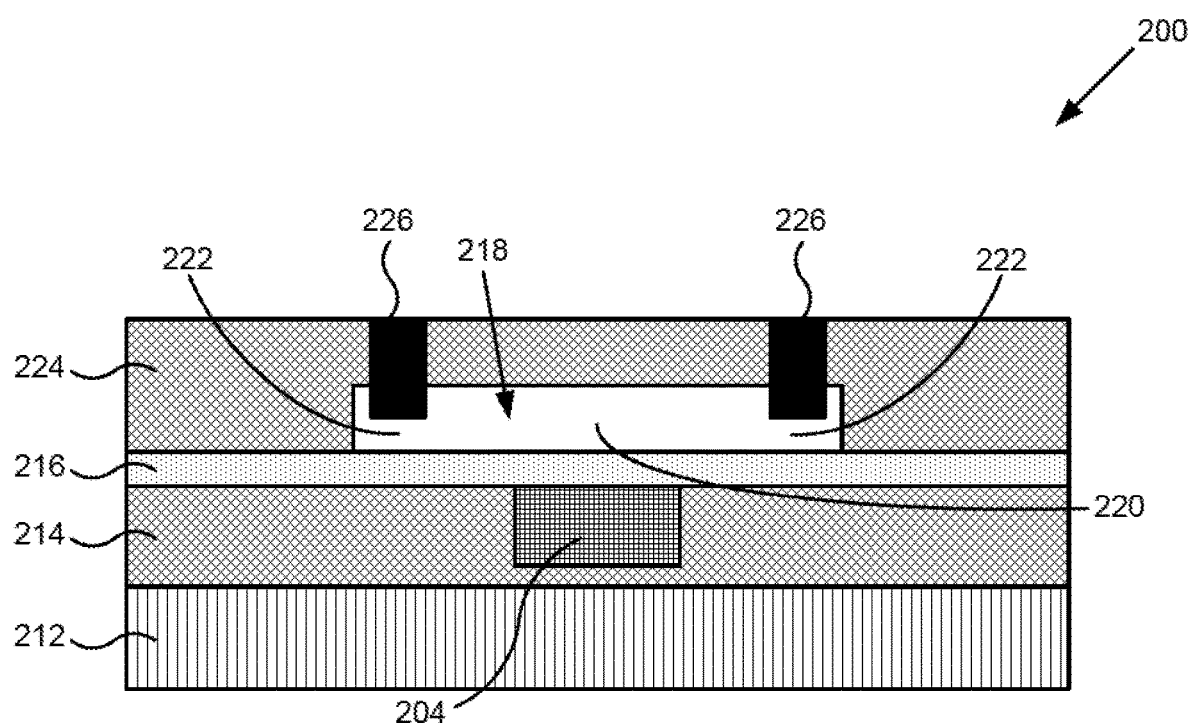
FIG. 2 illustrates a cross-sectional view of a portion of an RF switch according to one implementation of the present application.

FIG. 2 illustrates a cross-sectional view of a portion of a PCM RF switch according to one implementation of the present application. FIG. 2 can represent a cross-sectional view along line "2--2" in FIG. 1. RF switch 200 shown in FIG. 2 includes substrate 212, lower dielectric 214, heater line 204, thermally conductive and electrically insulating layer 216, PCM 218 having active segment 220 and passive segments 222, upper dielectric 224, and PCM contacts 226.

Substrate 212 is situated under lower dielectric 214. In one implementation, substrate 212 is an insulator, such as silicon oxide ($SiO_2$). In various implementations, substrate 212 is a silicon (Si), silicon-on-insulator (SOI), sapphire, complementary metal-oxide-semiconductor (CMOS), bipolar CMOS (BiCMOS), or group III-V substrate. In various implementations, a heat spreader is integrated with substrate 212, or substrate 212 itself performs as a heat spreader. Substrate 212 can have additional layers (not shown in FIG. 2). In one implementation, substrate 212 can comprise a plurality of interconnect metal levels and interlayer dielectric layers. Substrate 212 can also comprise a plurality of devices, such as integrated passive devices (IPDs) (not shown in FIG. 2).

Lower dielectric 214 is situated on top of substrate 212, and is adjacent to the sides of heater line 204. In the present implementation, lower dielectric 214 extends along the width of RF switch 200, and is also situated under heater line 204. In various implementations, lower dielectric 214 can have a relative width and/or a relative thickness greater or less than shown in FIG. 2. Lower dielectric 214 may comprise a material with thermal conductivity lower than that of thermally conductive and electrically insulating layer 216. In various implementations, lower dielectric 214 can comprise silicon oxide ($SiO_2$), silicon nitride ($Si_XN_Y$), or another dielectric.

Heater line 204 is situated in lower dielectric 214. Heater line 204 also underlies active segment 220 of PCM 218. Heater line 204 generates a crystallizing heat pulse or an amorphizing heat pulse for transforming active segment 220 of PCM 218. Heater line 204 can comprise any material capable of Joule heating. Heater line 204 can be connected to electrodes of a current source (not shown in FIG. 2) that generates a crystallizing current pulse or an amorphizing current pulse. Heater line 204 in FIG. 2 generally corresponds to heater line 104 in FIG. 1 and may have any implementations and advantages described above.

Thermally conductive and electrically insulating layer 216 is situated on top of heater line 204 and lower dielectric 214, and under PCM 218 and, in particular, under active segment 220 of PCM 218. Thermally conductive and electrically insulating layer 216 ensures efficient heat transfer from heater line 204 toward active segment 220 of PCM 218, while electrically insulating heater line 204 from PCM contacts 226, PCM 218, and other neighboring structures. Thermally conductive and electrically insulating layer 216 can comprise any material with high thermal conductivity and high electrical resistivity. In various implementations, thermally conductive and electrically insulating layer 216 can comprise aluminum nitride (AlN), aluminum oxide ($Al_XO_Y$), beryllium oxide ($Be_XO_Y$), silicon carbide (SiC), diamond, or diamond-like carbon.

PCM 218 is situated on top of thermally conductive and electrically insulating layer 216. PCM 218 includes active segment 220 and passive segments 222. Active segment 220 of PCM 218 approximately overlies heater line 204 and is approximately defined by heater line 204. Passive segments 222 of PCM 218 extend outward and are transverse to heater line 204, and are situated approximately under PCM contacts 226. As used herein, "active segment" refers to a segment of PCM that transforms between crystalline and amorphous phases, for example, in response to a crystallizing or an amorphizing heat pulse generated by heater line 204, whereas "passive segment" refers to a segment of PCM that does not make such transformation and maintains a crystalline phase (i.e., maintains a conductive state). With proper heat pulses and heat dissipation, active segment 220 of PCM 218 can transform between crystalline and amorphous phases, allowing RF switch 200 to switch between ON and OFF states respectively. PCM 218 in FIG. 2 generally corresponds to PCM 118 in FIG. 1 and may have any implementations and advantages described above. It is noted that in FIG. 2, current flowing in heater line 204 flows substantially under active segment 220 of PCM 218.

Upper dielectric 224 is formed over PCM 218 and over thermally conductive and electrically insulating layer 216. In various implementations, upper dielectric 224 is $SiO_2$, boron-doped $SiO_2$, phosphorous-doped $SiO_2$, $Si_xN_y$, or another dielectric. In various implementations, upper dielectric 224 is a low-k dielectric, such as fluorinated silicon dioxide, carbon-doped silicon oxide, or spin-on organic polymer. Upper dielectric 224 can be formed, for example, by plasma enhanced CVD (PECVD), high density plasma CVD (HDP-CVD), or spin-on processes.

PCM contacts 226 extend through upper dielectric 224, and connect to passive segments 222 of PCM 218. PCM contacts 226 provide RF signals to and from PCM 218. In one implementation, a metal layer is deposited in and over upper dielectric 224, and then planarized with upper dielectric 224, for example, using chemical machine polishing (CMP), thereby forming PCM contacts 226. In an alternative implementation, a damascene process is used to form PCM contacts 226. PCM contacts 226 in FIG. 2 generally correspond to PCM contacts 126 in FIG. 1 and may have any implementations and advantages described above.

Figure 3:
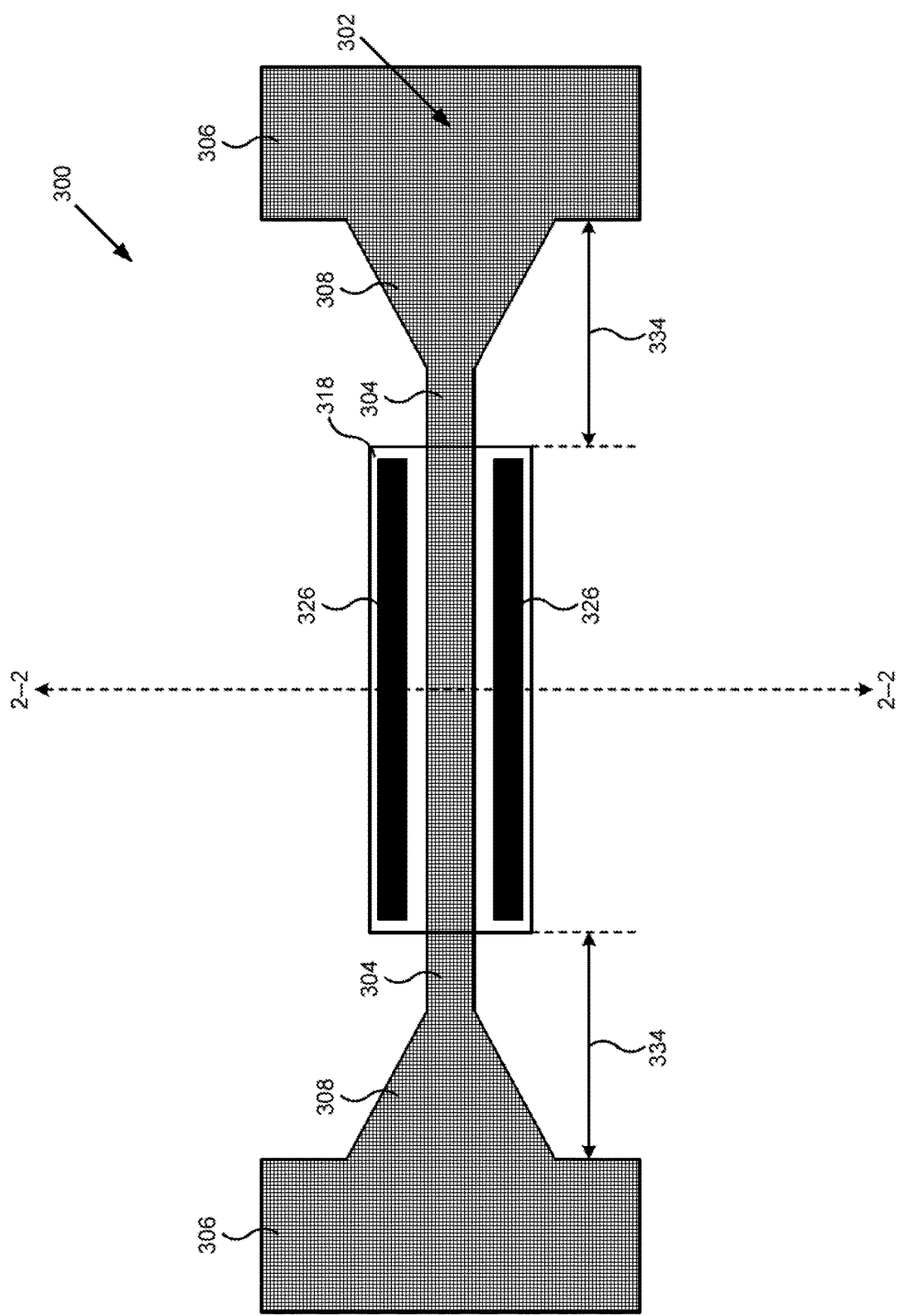
FIG. 3 illustrates a top view of a portion of an switch according to one implementation of the present application.

FIG. 3 illustrates a top view of a portion of a PCM RF switch according to one implementation of the present application. FIG. 2 can represent a cross-sectional view along line "2--2" in FIG. 3. RF switch 300 includes heating element 302 having heater line 304, heater contacts 306, and fan-out structures 308. PCM 318, PCM contacts 326, and heater contact-to-PCM spacing 334. Heater contact 306, PCM 318, and PCM contacts 326 in RF switch 300 in FIG. 3 are similar to corresponding structures in RF switch 100 in FIG. 1, and may have any implementations and advantages described above. For purposes of illustration, the top view in FIG. 3 shows selected structures. RF switch 300 may include other structures not shown in FIG. 3.

In RF switch 300, fan-out structures 308 connect heater line 304 to heater contacts 306. Fan-out structures 308 are wider near heater contacts 306, and narrower near heater line 304. In the present implementation, fan-out structures 308 are laid out as straight line trapezoids. In other implementation, fan-out structures 308 can be laid out as other shapes. In the present implementation, fan-out structures 308 comprise a solid fan-out metal that is the same metal as the rest of heating element 302. In another implementation, fan-out structures 308 comprise a different metal than the rest of heating element 302. As described below, fan-out structures 308 reduce heat generation outside PCM 318 and reduce heater contact-to-PCM parasitic capacitance of RF switch 300.

Figure 4A:
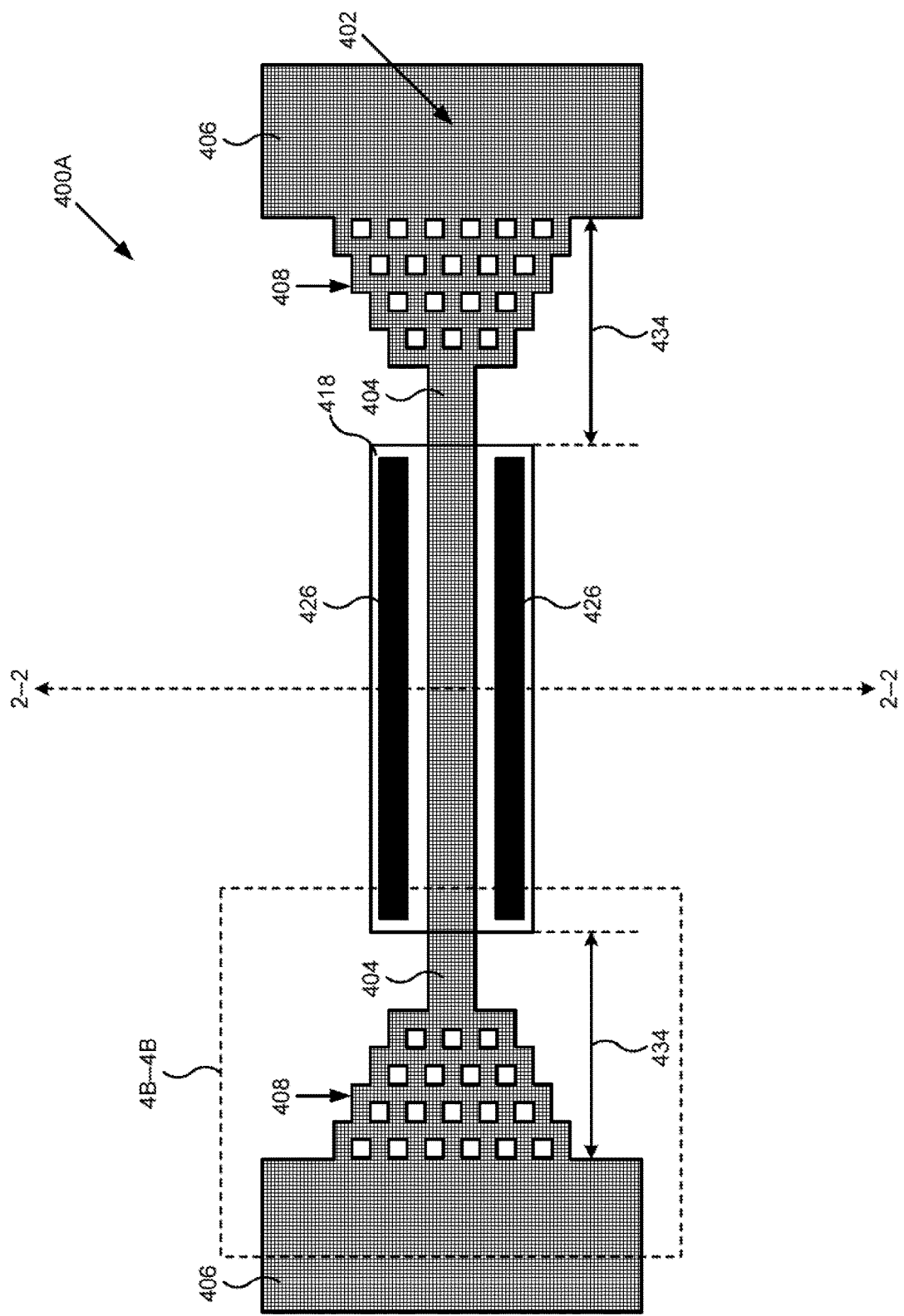
FIG. 4A illustrates a top view of a portion of an RF switch according to one implementation of the present application.

FIG. 4A illustrates a top view of a portion of a PCM RF switch according to one implementation of the present application. FIG. 2 can represent a cross-sectional view along line "2--2" in FIG. 4A. RF switch 400A includes heating element 402 having heater line 404, heater contacts 406, and fan-out structures 408, PCM 418, PCM contacts 426, and heater contact-to-PCM spacing 434. Heater contact 406, PCM 418, and PCM contacts 426 in RF switch 400A in FIG. 4A are similar to corresponding structures in RF switch 100 in FIG. 1, and may have any implementations and advantages described above. For purposes of illustration, the top view in FIG. 4A shows selected structures. RF switch 400A may include other structures not shown in FIG. 4A.

In RF switch 400A, fan-out structures 408 connect heater line 404 to heater contacts 406. Fan-out structures 408 are wider near heater contacts 406, and narrower near heater line 404. In the present implementation, fan-out structures 408 are laid out as stepped trapezoids. In other implementation, fan-out structures 408 can be laid out as other shapes. In the present implementation, fan-out structures 408 comprise dielectric segments interspersed between fan-out metal. In the present implementation, the fan-out metal is the same metal as the rest of heating element 402. In another implementation, fan-out structures 408 comprise a different metal than the rest of heating element 402. As described below, fan-out structures 408 reduce heat generation outside PCM 418, reduce heater contact-to-PCM parasitic capacitance of RF switch 400, and reduce dishing in fan-out structures 408.

Figure 4B:
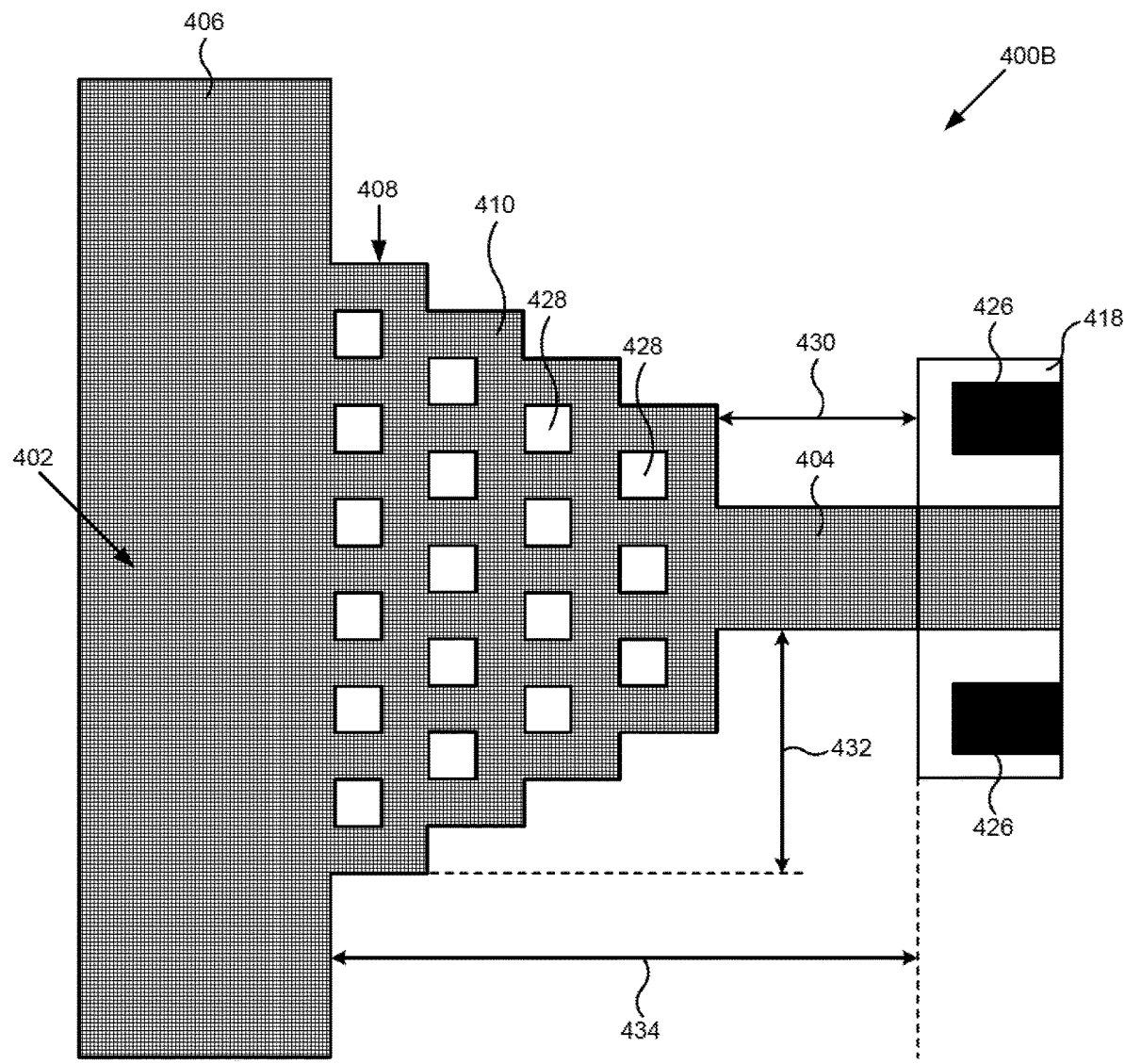
FIG. 4B illustrates a closer top view of a portion of an RF switch corresponding to the RF switch of FIG. 4A according to one implementation of the present application.

FIG. 4B illustrates a closer top view of a portion of a PCM RF switch corresponding to the RF switch of FIG. 4A according to one implementation of the present application. FIG. 4B represents a top view of outline "4B--4B" in FIG. 4A. RF switch 400B includes heating element 402 having heater line 404, heater contact 406, and fan-out structure 408 with dielectric segments 428 and fan-out metal 410, PCM 418, PCM contacts 426, standoff region 430, fan-out taper width 432, and heater contact-to-PCM spacing 434. Heater contact 406, PCM 418, and PCM contacts 426 in RF switch 400B in FIG. 4B are similar to corresponding structures in RF switch 100 in FIG. 1, and may have any implementations and advantages described above. For purposes of illustration, the top view in FIG. 4B shows selected structures. RF switch 400B may include other structures not shown in FIG. 4B.

In RF switch 400B, fan-out structures 408 are laid out as stepped trapezoids. Fan-out structures 408 comprise dielectric segments 428 interspersed between fan-out metal 410. In the present implementation, dielectric segments 428 are squares arranged in columns. Each column is evenly spaced. Dielectric segments 428 of each column are offset from dielectric segments 428 of adjacent columns. Within each column, dielectric segments 428 are evenly spaced. In one implementation, the length and width of dielectric segments 428, the spacing between dielectric segments 428, and the spacing between columns are a minimum process dimension. In another implementation, they are an integer multiple of a minimum process dimension. In various implementations, dielectric segments may have different shapes, arrangements, and spacing. In one implementation, dielectric segments 428 may be interspersed in a fan-out structure laid out as a straight line trapezoid (as in FIG. 3). Fan-out structure 408 having dielectric segments 428 interspersed between fan-out metal 410 may be formed by a damascene process, a subtractive etch process, or any other suitable process.

Fan-out structure 408 is separated from PCM 418 by standoff region 430. Standoff region 430 reduces parasitic capacitance between PCM 418 and fan-out structure 408. Standoff region 430 also prevents undesirable heating of PCM 418 and PCM contacts 426. For example, despite the reduced heat generation of fan-out structure 408, without standoff region 430, the side of fan-out structure 408 nearest PCM 418 may heat passive segments of PCM 418 under PCM contacts 426 as well as PCM contacts 426 themselves. Standoff region 430 thus reduces thermal cycling consequences to these structures. Notably, standoff regions are present in FIGS. 3 and 4A even though they are not labeled.

Fan-out taper width 432 represents an increase in width of heating element 402 between heater line 404 and the widest portion of fan-out structure 408. In the present implementation, because fan-out structure 408 is symmetrical, fan-out taper width 432 is half the total increase in width of heating element 402. As described above, fan-out taper width 432 may be an integer multiple of a minimum process dimension. A larger fan-out taper width 432 generally further reduces heat generation by heating element 402 outside PCM 418.

By utilizing the structures disclosed in the present application, an RF switch with improved thermal and electrical RF performance can be achieved. Because heating element 302 in FIG. 3 utilizes fan-out structures 308 for connecting heater line 304 to heater contacts 306, fan-out structures 308 taper heating element 302 between wider heater contacts 306 and narrower heater line 304. Compared to the resistance of heating element 102 in FIG. 1, the resistance of heating element 302 in FIG. 3 is reduced. As a result, heat generation outside PCM 318 is also reduced. Thus, heater contacts 306 can be situated farther from PCM 318 (i.e., heater contact-to-PCM spacing 334 can be made large). Heater contact-to-PCM parasitic capacitance can be reduced, thereby reducing a total insertion loss of RF switch 300 in the ON state and reducing a total OFF state parasitic capacitance ($C_{OFF}$) of RF switch 300 in the OFF state. Additionally, fan-out structures 308 reduce current crowding and electromigration damage in heating element 302.

Notably, because fan-out structures 308 have wide solid fan-out metals, they are susceptible to dishing. For example, when heating element 302 is planarized by CMP, fan-out structures 308 will dish, causing uneven thickness and/or damaged regions. Because heating element 302 requires high currents to generate heat pulses, heating element 302 is particularly sensitive to variations in thickness. Thinner segments will heat significantly more than thicker segments. The increased heat of thinner segments represents wasted power. Heating element 302 will require higher applied pulse power in order for heater line 304 to transform PCM 318. Furthermore, if a segment overheats, heating element 302 can become permanently damaged and the RF switch may fail to function. Damaged regions also weaken heating element 302, allowing it to break more easily.

Because heating element 402 in FIG. 4B utilizes fan-out structures 408, RF switch 400B also exhibits reduced heat generation outside PCM 418 and reduced heater contact-to-PCM parasitic capacitance, as described above. However, because fan-out structures 408 have dielectric segments 428 interspersed between fan-out metal 410, fan-out structures 408 also reduce dishing. For example, because fan-out structures 408 do not have wide solid fan-out metals, when heating element 402 is planarized by CMP, fan-out structures 408 will not dish, increasing the reliability of heating element 402.

It is noted that the resistance of fan-out structures 408 in the implementations of FIGS. 4A/4B may be higher relative to the resistance of fan-out structures 308 in the implementation of FIG. 3, due to the interspersed dielectric segments 428. However, parasitic capacitance between fan-out structures 408 and PCM 418 in the implementations of FIGS. 4A/4B may be lower relative to parasitic capacitance between fan-out structures 308 and PCM 318 in the implementation of FIG. 3, due to the reduced area of fan-out metal 410.

Figure 4C:
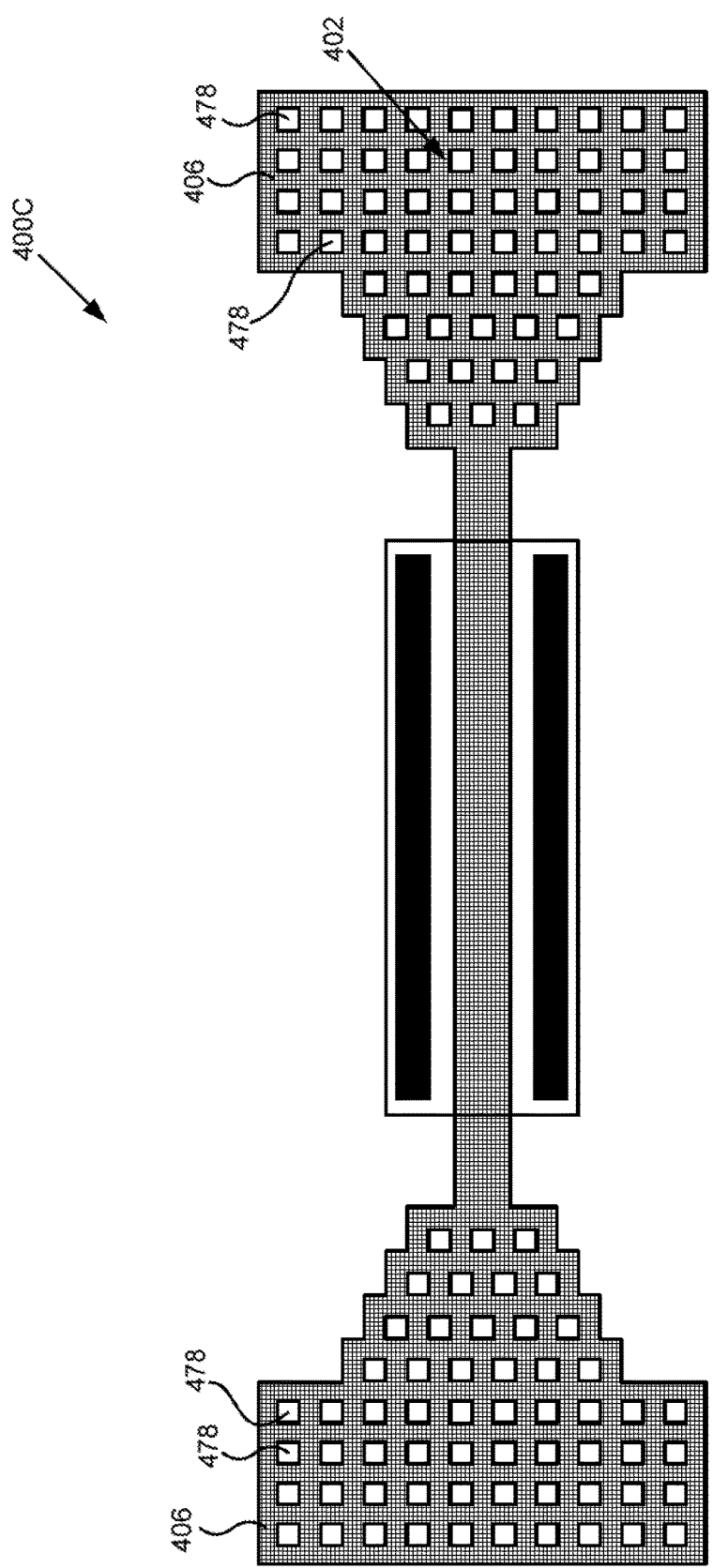
FIG. 4C illustrates a top view of a portion of an RF switch according to one implementation of the present application.

FIG. 4C illustrates an alternative implementation relative to FIG. 4A. The only difference between RF switch 400C in FIG. 4C and RF switch 400A in FIG. 4A is the introduction of interspersed dielectric segments 478 in heater contact 406 of heating element 402. That is to say, while heater contact 406 of RF switch 400A consists of solid metal, heater contact 406 of RF switch 400C includes interspersed dielectric segments 478 similar to interspersed dielectric segments 428 in fan-out metal 410 of RF switch 400A.

Interspersed dielectric segments 478 in RF switch 400C aid in preventing heater contact 406 from dishing during fabrication of the heater contact, especially when the process of choice is a damascene process as opposed to a subtractive etch process. It is noted that interspersed dielectric segments 428 and 478 can also provide process uniformity and/or heat profile modification as needed. Also of note is that vias (not shown) that connect to heater contact 406 either from a metal level under heater contact 406 or from a metal level above heater contact 406 would need to be carefully designed and placed on metal portions of heater contact 406 instead of interspersed dielectric segments 478. Interspersed dielectric segments 478 can assume a rectangular or square shape and the vias can also assume a rectangular or square cross-section in order to avoid interspersed dielectric segments 478 and to make full contact with metal portions of heater contact 406. Other features and benefits associated with heating element 402 in FIGS. 4A and 4B also apply to heating element 402 in FIG. 4C.

Figure 5:
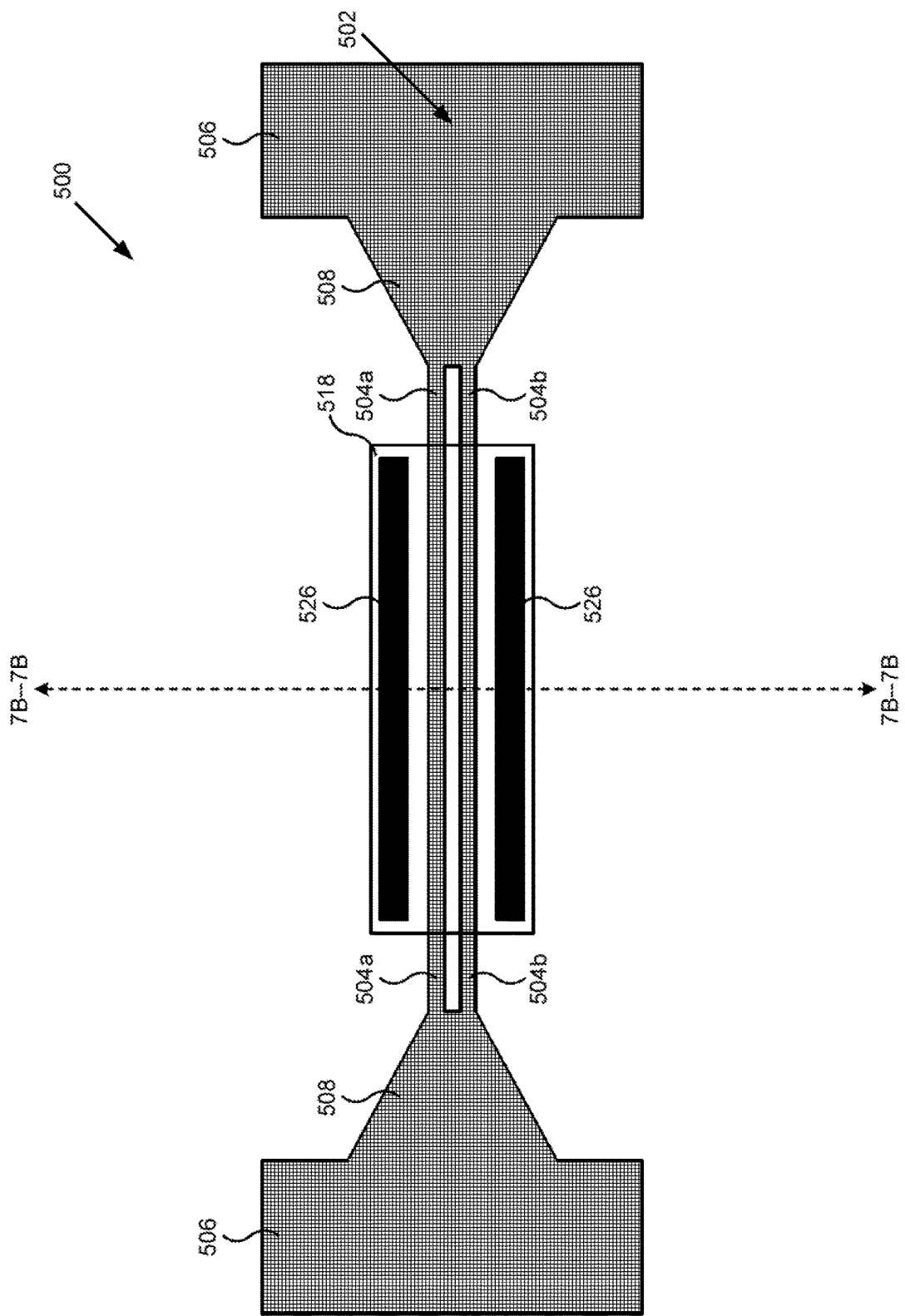
FIG. 5 illustrates a top view of a portion of an RF switch according to one implementation of the present application.

FIG. 5 illustrates a top view of a portion of a PCM RF switch according to one implementation of the present application. RF switch 500 includes heating element 502 having split heater lines 504a and 504b, heater contacts 506, and fan-out structures 508, PCM 518, and PCM contacts 526. For purposes of illustration, the top view in FIG. 5 shows selected structures. RF switch 500 may include other structures not shown in FIG. 5.

RF switch 500 in FIG. 5 is similar to RF switch 300 in FIG. 3, except that RF switch 500 in FIG. 5 includes two split heater lines 504a and 504b, rather than a single heater line 304. Split heater lines 504a and 504b are split from each other, but both underlie PCM 518 and connect to fan-out structures 508. In the present implementation, heating element 502 includes two split heater lines. In various implementations, heating element 502 can include more than two split heater lines. As described below, split heater lines 504a and 504b increase an area of the active segment of PCM 518, and reduce a heater-to-PCM parasitic capacitance.

Figure 6A:
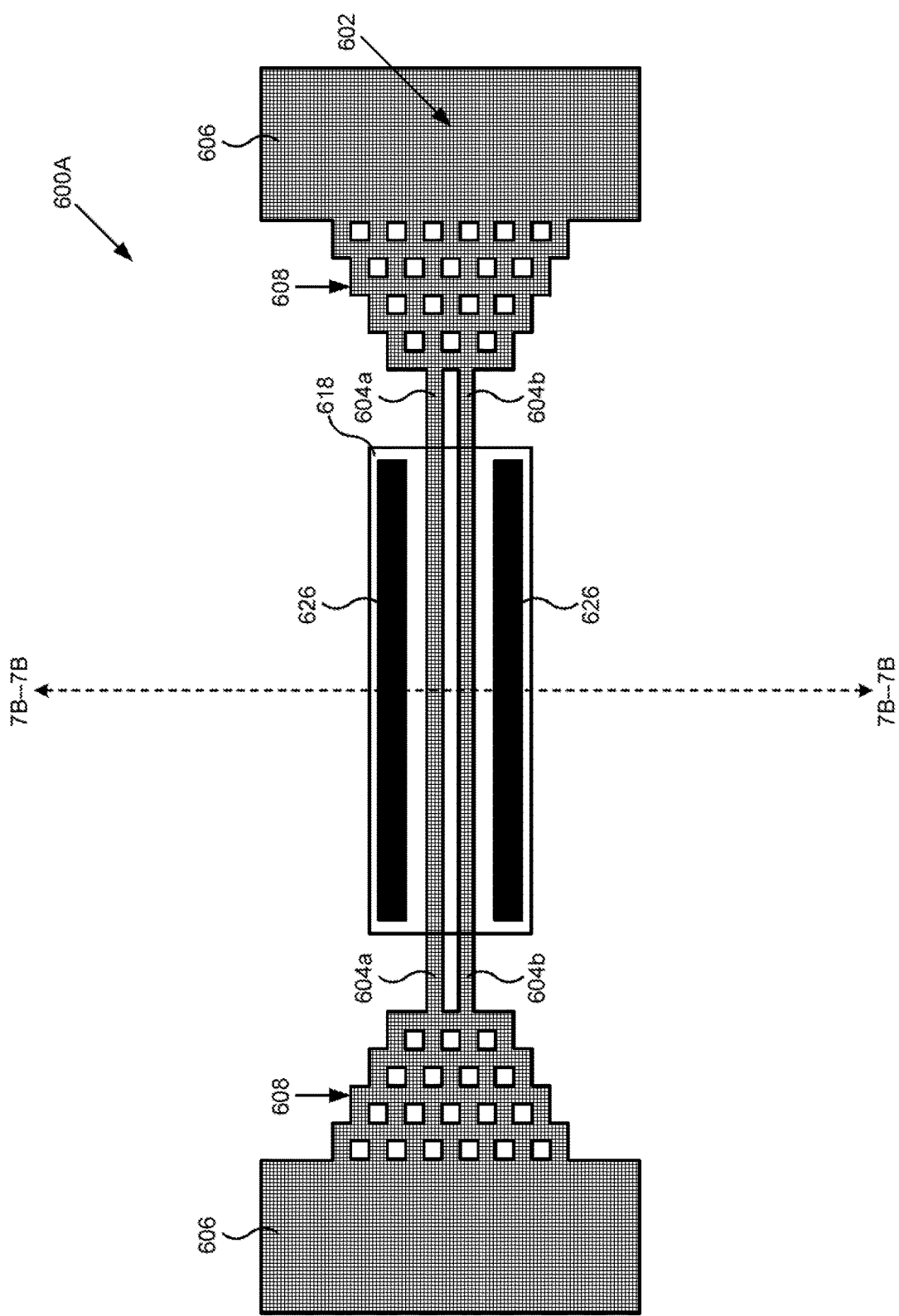
FIG. 6A illustrates a top view of a portion of an RF switch according to one implementation of the present application.

FIG. 6A illustrates a top view of a portion of a PCM RF switch according to one implementation of the present application. RF switch 600A includes heating element 602 having split heater lines 604a and 604b, heater contacts 606, and fan-out structures 608, PCM 618, and PCM contacts 626. For purposes of illustration, the top view in FIG. 6A shows selected structures. RF switch 600A may include other structures not shown in FIG. 6A.

RF switch 600A in FIG. 6A is similar to RF switch 400A/400B in FIGS. 4A/4B, except that RF switch 600A in FIG. 6A includes two split heater lines 604a and 604b, rather than a single heater line 404. Split heater lines 604a and 604b are split from each other, but both underlie PCM 618 and connect to fan-out structures 608. In the present implementation, heating element 602 includes two split heater lines. In various implementations, heating element 602 can include more than two split heater lines. As described below, split heater lines 604a and 604b increase an area of the active segment of PCM 618, and reduce a heater-to-PCM parasitic capacitance.

Figure 6B:
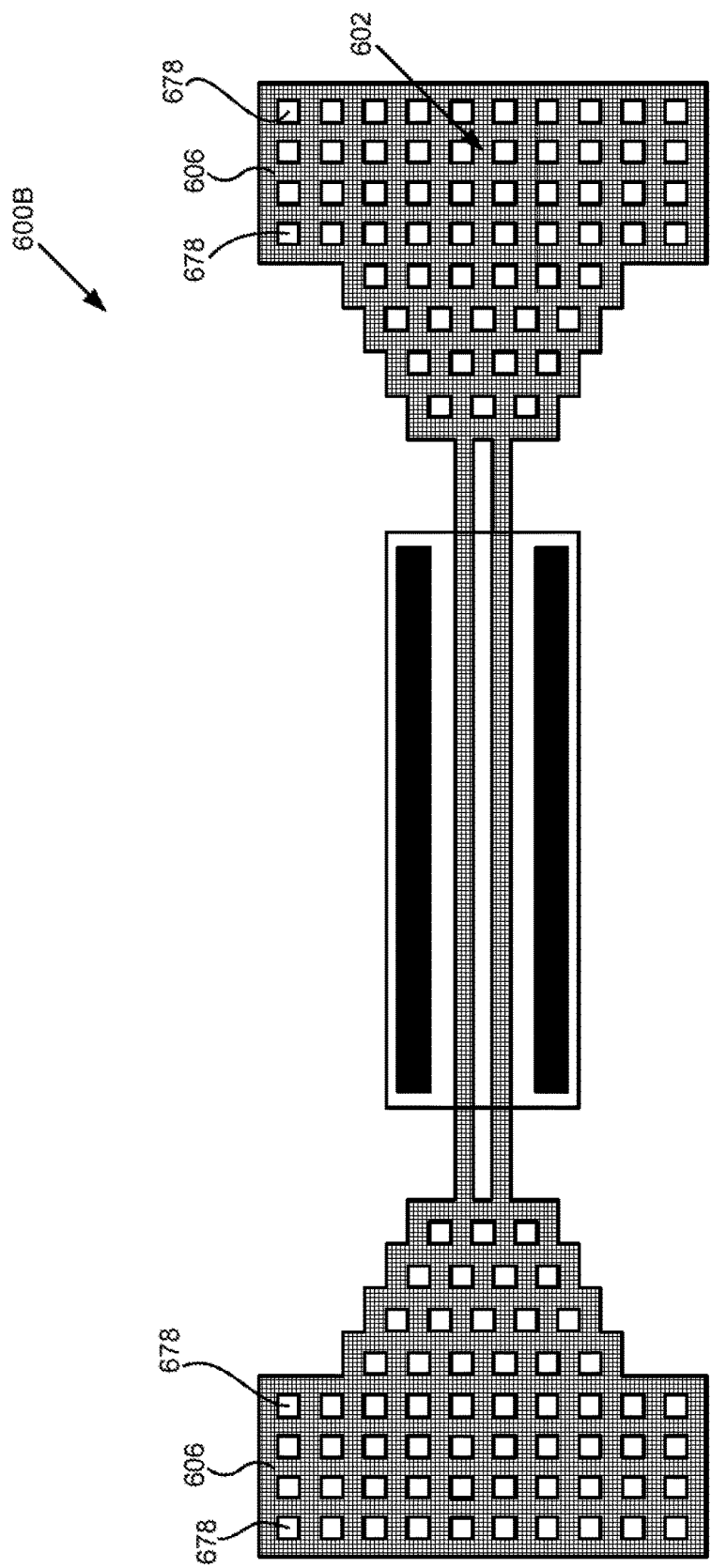
FIG. 6B illustrates a top view of a portion of an RF switch according to one implementation of the present application.

FIG. 6B illustrates an alternative implementation relative to FIG. 6A. The only difference between RF switch 600B in FIG. 6B and RF switch 600A in FIG. 6A is the introduction of interspersed dielectric segments 678 in heater contact 606 of heating element 602. That is to say, while heater contact 606 of RF switch 600A consists of solid metal, heater contact 606 of RF switch 600B includes interspersed dielectric segments 678.

Interspersed dielectric segments 678 in RF switch 600B aid in preventing heater contact 606 from dishing during fabrication of the heater contact, especially when the process of choice is a damascene process as opposed to a subtractive etch process. It is noted that interspersed dielectric segments in both FIGS. 6A and 6B can also provide process uniformity and/or heat profile modification as needed. Also of note is that vias (not shown) that connect to heater contact 606 either from a metal level under heater contact 606 or from a metal level above heater contact 606 would need to be carefully designed and placed on metal portions of heater contact 606 instead of interspersed dielectric segments 678. Interspersed dielectric segments 678 can assume a rectangular or square shape and the vias can also assume a rectangular or square cross-section in order to avoid interspersed dielectric segments 678 and to make full contact with metal portions of heater contact 606. Other features and benefits associated with heating element 602 in FIG. 6A also apply to heating element 602 in FIG. 6B.

Figure 7A:
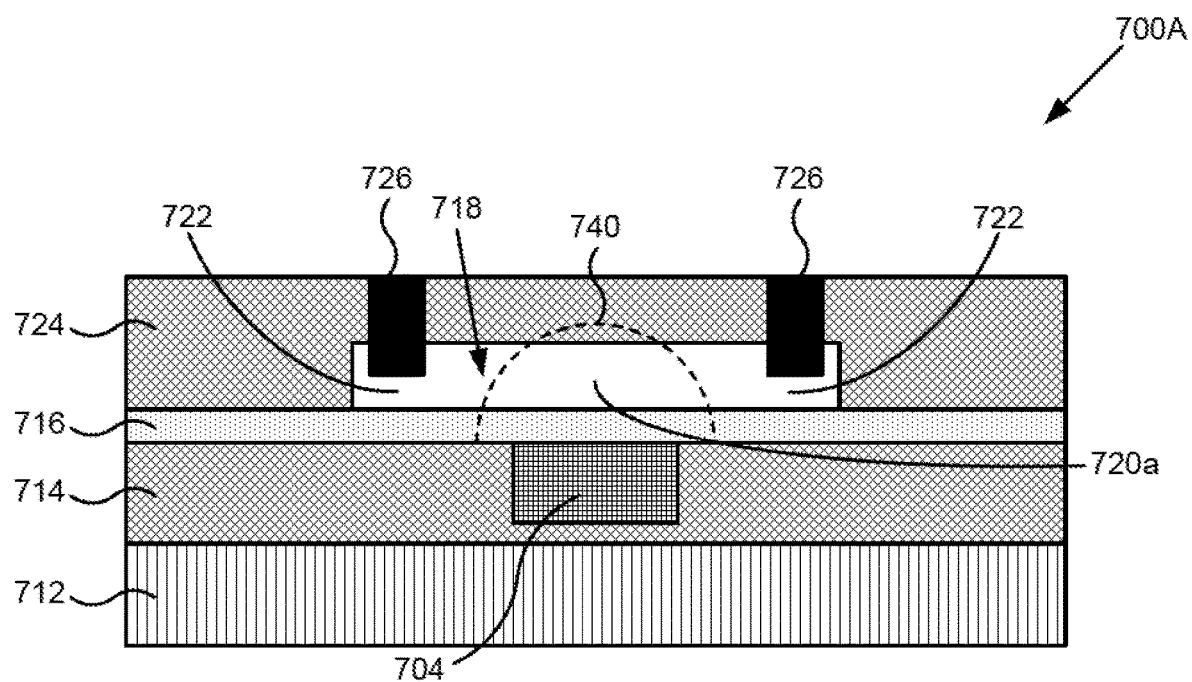
FIG. 7A illustrates a cross-sectional view of a portion of an RF switch according to one implementation of the present application.

FIG. 7A illustrates a cross-sectional view of a portion of a PCM RF switch according to one implementation of the present application. FIG. 7A can represent a cross-sectional view along line "2--2" in FIG. 1. RF switch 700A shown in FIG. 7A includes substrate 712, lower dielectric 714, heater line 704, thermally conductive and electrically insulating layer 716, PCM 718 having active segment 720a and passive segments 722, upper dielectric 724, PCM contacts 726, and heat contour 740.

RF switch 700A in FIG. 7A is similar to RF switch 200 in FIG. 2, except that RF switch 700A in FIG. 7A illustrates heat contour 740. Heat contour 740 represents an area of RF switch 700A having a temperature capable to transform PCM 718 during a heat pulse. As described below, heat contour 740 will substantially define active segment 720a of PCM 718. Notably, RF switch 700A has a single heat contour corresponding to a heat pulse generated by a single heater line 704. Heater line 704 creates parasitic capacitances with PCM 718 and with PCM contacts 726. These parasitic capacitances, referred to collectively as "heater-to-PCM parasitic capacitance," significantly degrade the frequency response of RF switch 700A in both the ON and OFF states.

Figure 7B:
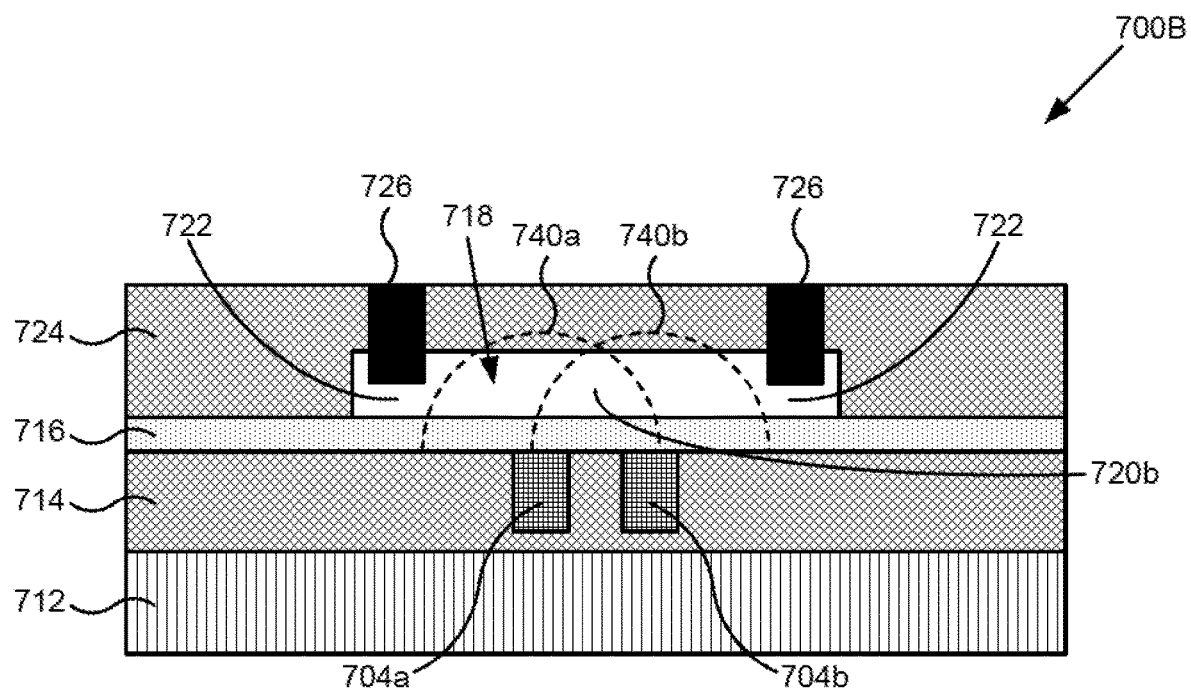
FIG. 7B illustrates a cross-sectional view of a portion of an RF switch according to one implementation of the present application.

FIG. 7B illustrates a cross-sectional view of a portion of an RF switch according to one implementation of the present application. FIG. 7B can represent a cross-sectional view along line "7B--7B" in FIGS. 5 and 6. RF switch 700B shown in FIG. 7B includes substrate 712, lower dielectric 714, split heater lines 704a and 704b, thermally conductive and electrically insulating layer 716, PCM 718 having active segment 720b and passive segments 722, upper dielectric 724, PCM contacts 726, and heat contours 740a and 740b.

RF switch 700B in FIG. 7B is similar to RF switch 700A in FIG. 7A, except that RF switch 700B in FIG. 7B has two heat contours 740a and 740b corresponding to heat pulses generated by two split heater lines 704a and 704b. As described below, heat contours 740a and 740b will substantially define an increased area for active segment 720b in FIG. 7B relative to the area of active segment 720a in FIG. 7A.

Split heater lines 704a and 704b also have lower dielectric 714 situated between them. In the present implementation, the combined width of split heater lines 704a and 704b in FIG. 7B is smaller than the width of heater line 704 in FIG. 7A. As a result, less conductive surface capacitively couples with PCM 718. Thus, split heater lines 704a and 704b in FIG. 7B reduce heater-to-PCM parasitic capacitance, thereby reducing a total insertion loss of RF switch 700B in the ON state and reducing a total OFF state parasitic capacitance ($C_{OFF}$) of RF switch 700B in the OFF state.

Figure 8A:
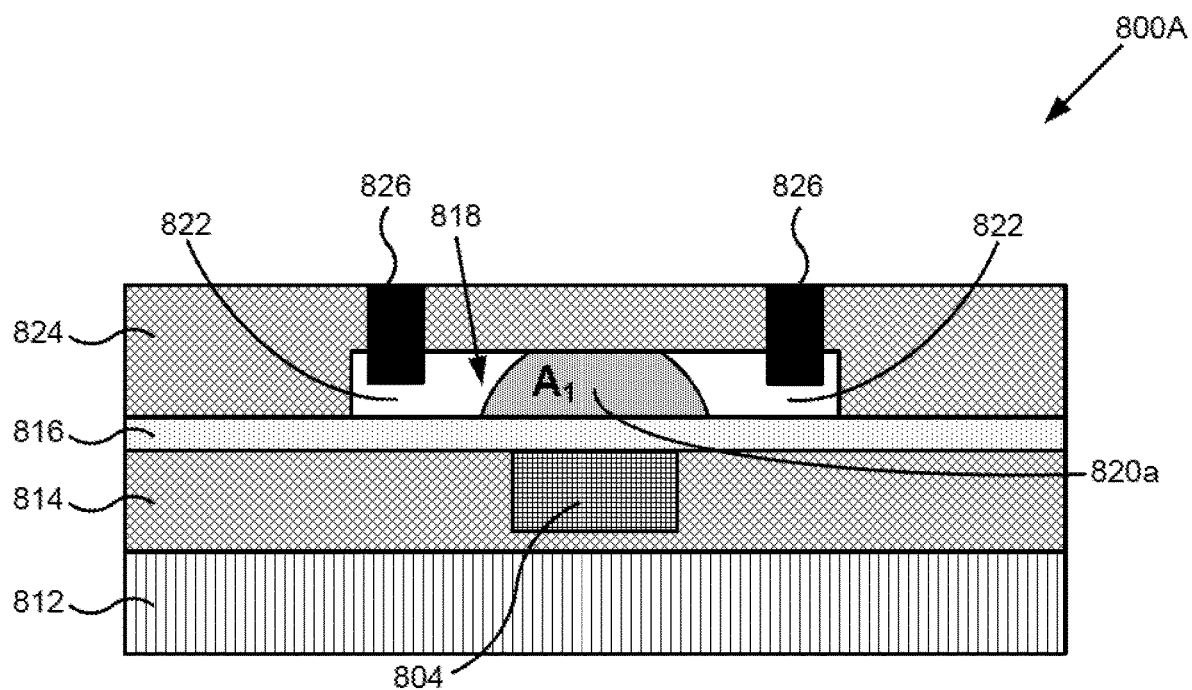
FIG. 8A illustrates a cross-sectional view of a portion of an RF switch corresponding to the RF switch of FIG. 7A according to one implementation of the present application.

FIG. 8A illustrates a cross-sectional view of a portion of a PCM RF switch corresponding to the RF switch of FIG. 7A according to one implementation of the present application. RF switch 800A shown in FIG. 8A includes substrate 812, lower dielectric 814, heater line 804, thermally conductive and electrically insulating layer 816, PCM 818 having active segment 820a and passive segments 822, upper dielectric 824, and PCM contacts 826.

RF switch 800A in FIG. 8A is similar to RF switch 700A in FIG. 7A, except that RF switch 800A in FIG. 8A illustrates area $A_1$ of active segment 820a of PCM 818 corresponding to heat contour 740 (shown in FIG. 7A). For example, area $A_1$ of active segment 820a may represent an amorphous area of PCM 818 transformed in response to an amorphizing heat pulse generated by heater line 804. As shown in FIG. 8A, area $A_1$ of active segment 820a of PCM 818 occupies a relatively small portion of the total area of PCM 818. Thus, a relatively small area $A_1$ of PCM 818 transforms into a high-resistivity amorphous phase in response to an amorphizing heat pulse from heater line 804. As a result, when RF switch 800A is in an OFF state, the electric field across the relatively small active segment 820a is relatively strong, and RF switch 800A cannot withstand high voltages, and thus its breakdown voltage and linearity are low.

Figure 8B:
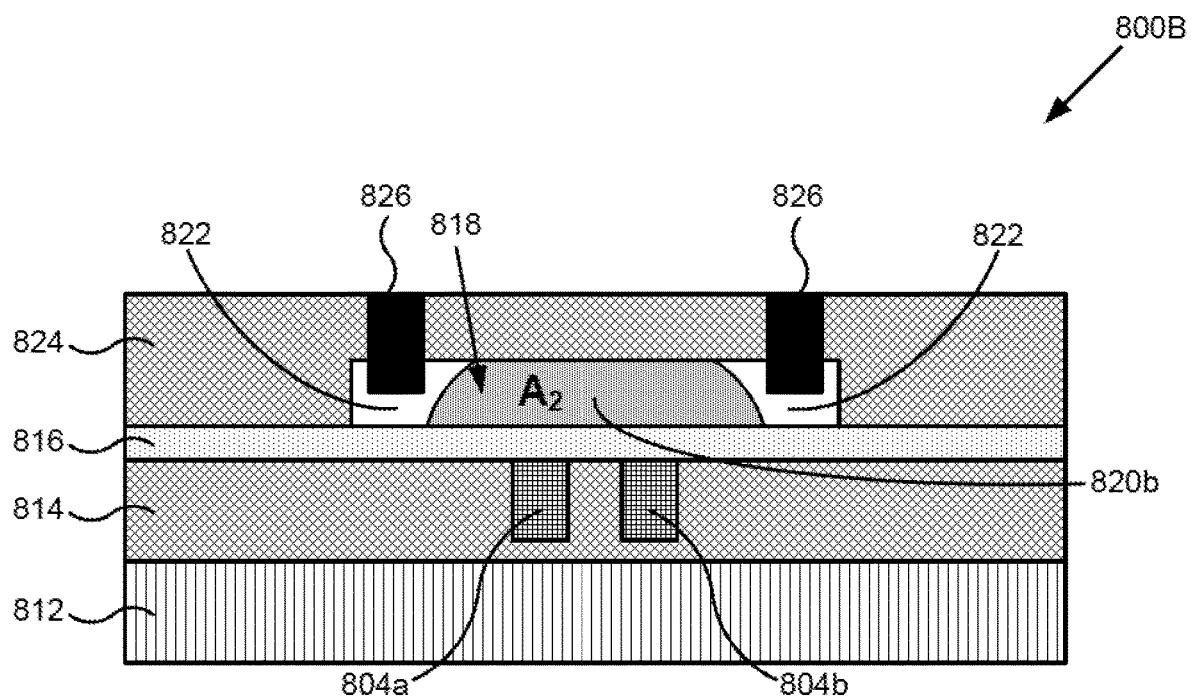
FIG. 8B illustrates a cross-sectional view of a portion of an RF switch corresponding to the RF switch of FIG. 7B according to one implementation of the present application.

FIG. 8B illustrates a cross-sectional view of a portion of a PCM RF switch corresponding to the RF switch of FIG. 7B according to one implementation of the present application. RF switch 800B shown in FIG. 8B includes substrate 812, lower dielectric 814, split heater lines 804a and 804b, thermally conductive and electrically insulating layer 816, PCM 818 having active segment 820b and passive segments 822, upper dielectric 824, and PCM contacts 826.

RF switch 800B in FIG. 8B is similar to RF switch 700B in FIG. 7B, except that RF switch 800B in FIG. 8B illustrates area $A_2$ of active segment 820b of PCM 818 corresponding to heat contours 740a and 740b (shown in FIG. 7B). For example, area $A_2$ of active segment 820b may represent an amorphous area of PCM 818 transformed in response to amorphizing heat pulses generated by split heater lines 804a and 804b. As shown in FIG. 8A, area $A_2$ of active segment 820b of PCM 818 occupies a relatively large portion of the total area of PCM 818, including an area overlying lower dielectric 814 between split heater lines 804a and 804b. Thus, a relatively large area $A_2$ of PCM 818 transforms into a high-resistivity amorphous phase in response to amorphizing heat pulses from split heater lines 804a and 804b. As a result, when RF switch 800B is in an OFF state, the electric field across the relatively large active segment 820b is relatively weak, and RF switch 800B can withstand high voltages, and thus its breakdown voltage and linearity are increased.

By utilizing split heater lines, such as split heater lines 504a and 504b in FIG. 5 (or split heater lines 604a and 604b in FIG. 6A), an RF switch can increase an area of an active segment of PCM, and can reduce heater-to-PCM parasitic capacitance. For example, two split heater lines 504a and 504b (or split heater lines 604a and 604b) that are each half a micron (0.5 µm) wide may have a heater-to-PCM parasitic capacitance similar to a single heater line that is one micron (1.0 µm) wide, but the two split heater lines 504a and 504b (or split heater lines 604a and 604b) will have an increased area of an active segment of PCM 518 (or PCM 618). Conversely, two split heater lines 504a and 504b (or split heater lines 604a and 604b) that are each half a micron (0.5 µm) wide may have an area of an active segment of PCM 518 (or PCM 618) similar to a single heater line that is one micron (1.5 µm) wide, but the two split heater lines 504a and 504b (or split heater lines 604a and 604b) will have a reduced heater-to-PCM parasitic capacitance.

Thus, various implementations of the present application achieve reliable, thermally efficient, low-parasitic RF switch that overcomes the deficiencies in the art. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A radio frequency (RF) switch comprising:
a heating element;
a phase-change material (PCM) situated over said heating element;
PCM contacts situated over passive segments of said PCM;
said heating element extending transverse to said PCM, a heater line of said heating element underlying an active segment of said PCM;
a fan-out structure comprising fan-out metal for connecting said heater line of said heating element to a heater contact;
said fan-out structure reducing heat generation outside said active segment of said PCM and reducing a heater contact-to-PCM parasitic capacitance.

2. The RF switch of claim 1, wherein said fan-out structure comprises dielectric segments interspersed between said fan-out metal to reduce dishing in said fan-out structure.

3. The RF switch of claim 1, wherein said fan-out structure is wider near said heater contact and narrower near said heater line.

4. The RF switch of claim 3, wherein said fan-out structure is laid out as a straight line trapezoid.

5. The RF switch of claim 3, wherein said fan-out structure is laid out as a stepped trapezoid.

6. The RF switch of claim 1, wherein said fan-out structure is separated from said PCM by a standoff region.

7. A radio frequency (RF) switch comprising:
a heating element;
a phase-change material (PCM) situated over said heating element;
PCM contacts situated over passive segments of said PCM;
said heating element extending transverse to said PCM, said heating element comprising split heater lines underlying an active segment of said PCM;
said split heater lines of said heating element resulting in an increase in an area of said active segment and reducing a heater-to-PCM parasitic capacitance.

8. The RF switch of claim 7, wherein said split heater lines consist of two heater lines.

9. The RF switch of claim 7, wherein said split heater lines consist of more than two heater lines.

10. The RF switch of claim 7, wherein said active segment of said PCM overlies a region between said split heater lines.

11. The RF switch of claim 7, wherein said split heater lines of said heating element increase a breakdown voltage of said RF switch.

12. A radio frequency (RF) switch comprising:
a heating element;
a phase-change material (PCM) situated over said heating element;
PCM contacts situated over passive segments of said PCM;
said heating element extending transverse to said PCM, said heating element comprising split heater lines underlying an active segment of said PCM;
a fan-out structure comprising fan-out metal for connecting said split heater lines of said heating element to a heater contact;
said split heater lines of said heating element resulting in an increase in an area of said active segment and reducing a heater-to-PCM parasitic capacitance.

13. The RF switch of claim 12, wherein said fan-out structure reduces heat generation outside said active segment of said PCM and reduces a heater contact-to-PCM parasitic capacitance.

14. The RF switch of claim 12, wherein said fan-out structure comprises dielectric segments interspersed between said fan-out metal to reduce dishing in said fan-out structure.

15. The RF switch of claim 12, wherein said active segment of said PCM overlies a region between said split heater lines.

16. The RF switch of claim 12, wherein said split heater lines of said heating element increase a breakdown voltage of said RF switch.

17. The RF switch of claim 12, wherein said fan-out structure is wider near said heater contact and narrower near said heater line.

18. The RF switch of claim 17, wherein said fan-out structure is laid out as a straight line trapezoid.

19. The RF switch of claim 17, wherein said fan-out structure is laid out as a stepped trapezoid.

20. The RF switch of claim 12, wherein said fan-out structure is separated from said PCM by a standoff region.

* * * * *